United States Patent
Choi et al.

(10) Patent No.: US 8,144,531 B2
(45) Date of Patent: Mar. 27, 2012

(54) LATENCY CONTROL CIRCUIT, SEMICONDUCTOR MEMORY DEVICE INCLUDING THE SAME, AND METHOD FOR CONTROLLING LATENCY

(75) Inventors: Hae-Rang Choi, Gyeonggi-do (KR);
Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Ji-Wang Lee, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 288 days.

(21) Appl. No.: 12/633,387

(22) Filed: Dec. 8, 2009

(65) Prior Publication Data
US 2011/0058433 A1   Mar. 10, 2011

(30) Foreign Application Priority Data
Sep. 4, 2009   (KR) ..................... 10-2009-0083441

(51) Int. Cl.
*G11C 7/22*   (2006.01)
(52) U.S. Cl. ..................... 365/194; 365/233.1
(58) Field of Classification Search .................. None
See application file for complete search history.

(56) References Cited

U.S. PATENT DOCUMENTS

| | | | | |
|---|---|---|---|---|
| 6,707,759 B2 * | 3/2004 | Song | ..................... | 365/189.15 |
| 6,944,091 B2 * | 9/2005 | Lee et al. | .................. | 365/189.15 |
| 7,065,003 B2 * | 6/2006 | Lee et al. | .................. | 365/194 |
| 7,292,486 B2 * | 11/2007 | Lee | ..................... | 365/194 |
| 7,590,013 B2 * | 9/2009 | Yu et al. | .................. | 365/194 |
| 7,751,261 B2 * | 7/2010 | Cho | ..................... | 365/194 |
| 7,911,862 B2 * | 3/2011 | Kim et al. | .................. | 365/203 |

FOREIGN PATENT DOCUMENTS
KR   1020080074361   8/2008

OTHER PUBLICATIONS
Notice of Preliminary Rejection issued from Korean Intellectual Property Office on Dec. 31, 2010.

* cited by examiner

*Primary Examiner* — Tan T. Nguyen
(74) *Attorney, Agent, or Firm* — IP & T Group LLP

(57) ABSTRACT

A latency control circuit includes a path calculator configured to calculate a delay value of a path that an input signal is to go through inside a chip and output the delay value as path information, a delay value calculator configured to output delay information representing a delay value for delaying the input signal based on a latency value of the input signal and the path information, and a delayer configured to delay the input signal by a delay corresponding to the delay information.

15 Claims, 3 Drawing Sheets

US 8,144,531 B2

LATENCY CONTROL CIRCUIT, SEMICONDUCTOR MEMORY DEVICE INCLUDING THE SAME, AND METHOD FOR CONTROLLING LATENCY

CROSS-REFERENCE TO RELATED APPLICATIONS

The present application claims priority of Korean Patent Application No. 10-2009-0083441, filed on Sep. 4, 2009, which is incorporated herein by reference in its entirety.

BACKGROUND OF THE INVENTION

The disclosed embodiments relate to a latency control circuit, and more particularly, to a technology for increasing accuracy of a latency control circuit.

Diverse semiconductor chips do not operate alone but transfer/receive signals to/from other neighboring semiconductor chips to operate. For example, when a memory controller applies a read command to a semiconductor memory device, the semiconductor memory device transfers data stored therein to the memory controller. However, the semiconductor memory device cannot transfer its data to the memory controller instantly after it receives the read command because time is required for the semiconductor memory device to call for and output the stored data inside.

For a first semiconductor chip A and a second semiconductor chip B to interact, it takes a predetermined waiting time for the first semiconductor chip A to request the second semiconductor chip B to perform a particular operation, and the second semiconductor chip B to perform the requested operation in response to the request. This waiting time is referred to as latency. For example, when CAS (column address strobe) latency (CL) is set at 7 clocks/clock cycles and the memory controller applies a read command to a semiconductor memory device, the semiconductor memory device transfers data to the memory controller 7 clocks after the application time point of the read command.

A circuit for controlling such latency that enables cooperation between the first semiconductor chip A and the second semiconductor chip B is referred to as latency control circuit.

FIG. 1 illustrates a conventional latency control circuit and its peripheral units. Referring to FIG. 1, an input signal INPUT inputted to an input pad 101 represents a signal inputted to a semiconductor chip, and a target circuit 140 is a circuit that performs an operation (for instance, an operation referred to hereinafter as "X" operation) in response to the input signal INPUT. Delay A 110 represents a delay that the input signal INPUT goes through inside the chip until it arrives at a latency control circuit 120, and delay B 130 represents a delay that the input signal INPUT outputted from the latency control circuit 120 goes through until it arrives at a target circuit 140.

When it is assumed that the latency between the input signal INPUT and the X operation is N, the target circuit 140 should perform the X operation at N clocks after the input signal INPUT is applied to the input pad 101. Therefore, the input signal INPUT inputted to the input pad 101 should arrive at the target circuit 140 exactly at N clocks thereafter. The latency control circuit 120 controls a delay value of the input signal INPUT in such a manner that the input signal INPUT arrives at the target circuit 140 at the time corresponding to the latency accurately.

As described before, the latency control circuit 120 is desired to control the delay value of the input signal INPUT so that the input signal INPUT inputted to the inside of the chip arrives at the target circuit 140 at N clocks later corresponding to the latency. However, there are many variables. The delay values of the delay A 110 and the delay B 130 continue to be changed as the process, voltage, and temperature (PVT) conditions are changed inside the chip. Therefore, there is a concern that the latency control circuit 120 does not transfer the input signal INPUT to the target circuit 140 at the exact time corresponding to the latency.

SUMMARY OF THE INVENTION

Some embodiments of the present invention are directed to a latency control circuit that transfers an input signal to a target circuit at an exact time.

Particularly, although the situation inside a chip may be changed due to a change in process, voltage and/or temperature (PVT) conditions, the latency control circuit makes the input signal inputted to the inside of the chip arrive at the target circuit at the exact time.

In accordance with an embodiment, there is provided a latency control circuit, which includes: a path calculator configured to calculate a delay value of a path that an input signal is to go through inside a chip and output the delay value as path information; a delay value calculator configured to output delay information representing a delay value for delaying the input signal based on a latency value of the input signal and the path information; and a delayer configured to delay the input signal by a delay corresponding to the delay information.

The delay value calculator may be configured to generate the delay information by subtracting a value of the path information from the latency value. The path information and the delay information may each represent a number of clock cycles.

The path calculator may include: a replica delay unit configured to have the same delay value as a delay value of the path that the input signal is to go through inside the chip, delay a path calculation start signal, and output a delayed path calculation start signal; and a first counting unit configured to count the number of clock activations from a moment when the path calculation start signal is enabled to a moment when an output signal of the replica delay unit is enabled and output the path information.

In accordance with another embodiment, there is provided a semiconductor memory device, which includes: a path calculator configured to calculate a delay value of a path that a termination command is to go through inside the semiconductor memory device and output the calculated delay value as path information; a delay value calculator configured to output delay information representing a delay value for delaying the termination command based on a write latency and the path information; a delayer configured to delay the termination command by a delay corresponding to the delay information; and a terminator configured to perform a termination onto an input pad in response to an output signal of the delayer.

In accordance with another embodiment of the present invention, there is provided a method for controlling a latency of an input signal inputted from outside a semiconductor chip, which includes: generating path information based on a delay value of a path that an input signal is to go through inside the chip and; generating delay information based on a latency value of the input signal and the path information; and delaying the input signal by a delay corresponding to the delay information and outputting a delayed input signal.

The delay information may be generated by subtracting a value of the path information from the latency value.

The calculating of the delay value of the path that the input signal is to go through inside the chip and generating the path information may include: delaying a path calculation start signal by the same delay value as the delay value of the path that the input signal is to go through inside the chip and outputting a delayed path calculation start signal; and counting the number of clock activations from a time that the path calculation start signal is enabled to a time that the delayed path calculation start signal is enabled and outputting the path information.

DESCRIPTION OF SPECIFIC EMBODIMENTS

Hereinafter, specific embodiments will be described with reference to the accompanying drawings. The drawings are not necessarily to scale and in some instances, proportions may have been exaggerated in order to clearly depict certain features of the embodiments.

Figure 1:
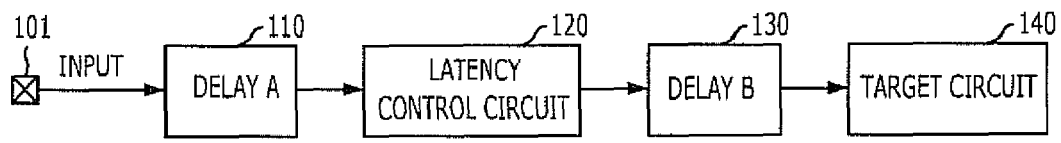
FIG. 1 illustrates a conventional latency control circuit and its peripheral units.
Figure 2:
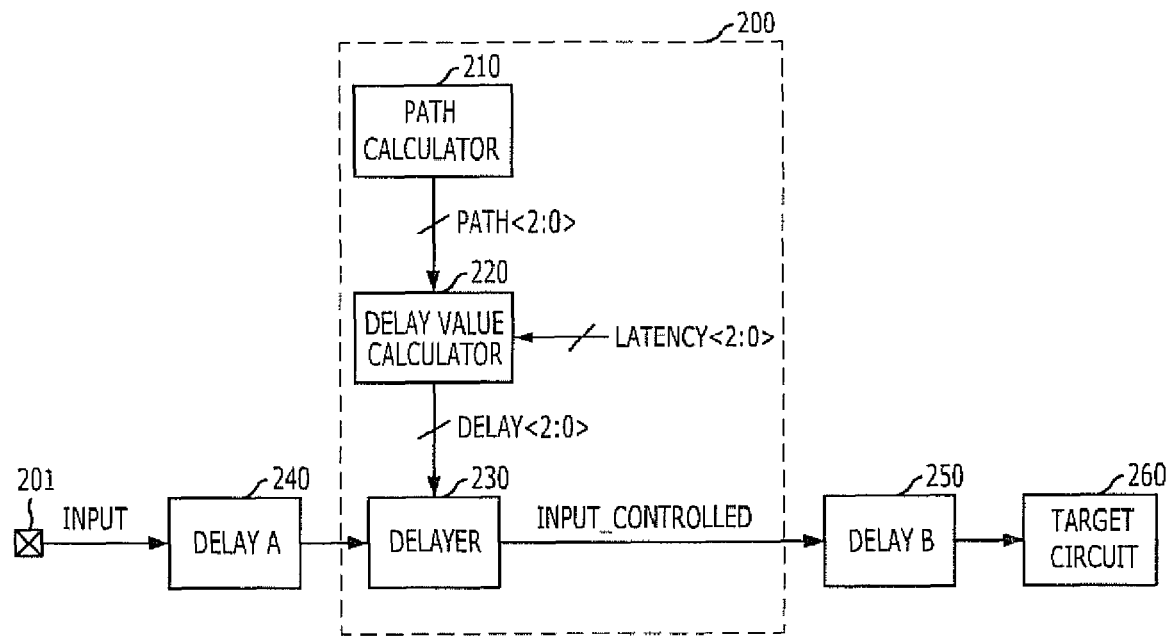
FIG. 2 is a block view illustrating a latency control circuit in accordance with an embodiment of the present invention.

FIG. 2 is a block view illustrating a latency control circuit in accordance with an embodiment of the present invention. Referring to FIG. 2, a latency control circuit 200 of the present embodiment includes a path calculator 210, a delay value calculator 220, and a delayer 230. The path calculator 210 calculates a delay value of a path which an input signal INPUT goes through and outputs the delay value as path information PATH<2:0>. The delay value calculator 220 outputs delay information DELAY<2:0> which represents a delay value for delaying the input signal INPUT based on latency information LATENCY<2:0> of the input signal INPUT and the path information PATH<2:0>. The delayer 230 delays the input signal INPUT by a delay corresponding to the delay information DELAY<2:0>.

A target circuit 260 shown in FIG. 2 is a circuit performing an operation that is directed by the input signal INPUT in response to the input signal INPUT. For example, when the input signal INPUT is a command to perform an X operation and the latency of the input signal INPUT is determined to be 7 clocks, the target circuit 260 is a circuit which should perform the X operation 7 clocks after the input signal INPUT is inputted into a chip, that is, a moment when the input signal INPUT is inputted into an input pad 201.

The path calculator 210 calculates a delay value of a path which the input signal INPUT is to go through inside the chip and outputs the delay value as path information PATH<2:0>. The delay value of a path through which the input signal INPUT is to go inside the chip is a value obtained by summing a delay of an the input signal INPUT through delay A 240, and a delay of an input signal INPUT_CONTROLLED through delay B 250. In short, the path information PATH<2:0> is a value obtained by quantizing a sum of a delay value of the delay A 240 and a delay value of the delay B 250 in terms of a number of clock-cycles.

The delay value calculator 220 outputs delay information DELAY<2:0>, which represents a delay value for delaying the input signal INPUT, based on the latency information LATENCY<2:0> and the path information PATH<2:0> of the input signal INPUT. To be specific, the delay value calculator 220 generates the delay information DELAY<2:0> by subtracting the path information PATH<2:0> from the latency information LATENCY<2:0>. In short, latency information LATENCY<2:0>−path information PATH<2:0>=delay information DELAY<2:0>. Herein, <2:0> signifies that each of the path information PATH<2:0>, latency information LATENCY<2:0>, and delay information DELAY<2:0> is a 3-bit data. It is obvious to those skilled in the art that the number of bits of each information path information PATH<2:0>, latency information LATENCY<2:0>, or delay information DELAY<2:0> may be different according to different schemes. The delay value calculator 220 may be formed of a simple subtraction circuit.

The delayer 230 outputs the input signal INPUT after delaying the input signal INPUT by a delay corresponding to the delay information DELAY<2:0>. To be specific, the delayer 230 outputs the input signal INPUT after delaying the input signal INPUT by a number of clocks corresponding to the number represented by the delay information DELAY<2:0>. For example, when the delay information DELAY<2:0> represents 4, the delayer 230 delays the input signal INPUT by 4 clocks and outputs the delayed input signal INPUT CONTROLLED.

To have a look at the overall operation, the path calculator 210 calculates a delay value of the input signal INPUT that the input signal INPUT is to go through inside the chip and outputs the calculated delay value as the path information PATH<2:0>. The delay value calculator 220 generates the delay information DELAY<2:0> by subtracting the value of path information PATH<2:0> from the value of the latency information LATENCY<2:0>. Subsequently, the delayer 230 delays the input signal INPUT by a delay corresponding to the delay information DELAY<2:0> and outputs the delayed input signal INPUT_CONTROLLED. In short, the input signal INPUT delayed for a delay corresponding to the delay DELAY<2:0> in the delayer 230 and delayed elsewhere by delays corresponding to a sum of DELAY A and DELAY B inside the chip in being communicated to the target circuit 260. Thus the input signal INPUT arrives at the target circuit 260 exactly after the latency period lapses from the input of the input signal INPUT to the input pad 201 of the chip.

Although the delay value inside the chip may be changed due to a change in process, voltage and/or temperature, the latency control circuit 200 of the present embodiment measures and reflects the change in the delay value, it is possible to make the input signal INPUT always arrive at the target circuit 260 accurately after the latency period lapses.

Figure 3:
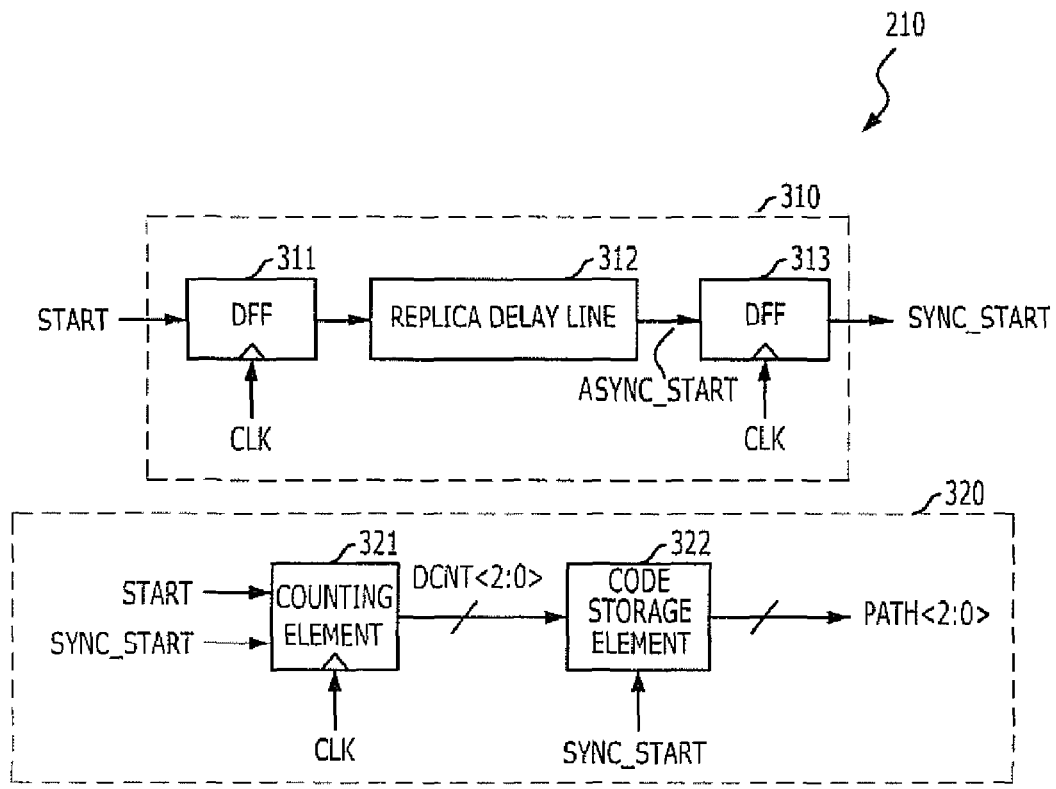
FIG. 3 is a block view describing a path calculator 210 of FIG. 2.

FIG. 3 is a block view describing the path calculator 210 of FIG. 2. Referring to FIG. 3, the path calculator 210 includes a replica delay unit 310 and a first counting unit 320. The replica delay unit 310 has the same delay value as the delay value of the path that the input signal INPUT is to go through inside the chip, and delays a path calculation start signal START and outputs the delayed path calculation start signal SYNC_START. The first counting unit 320 counts the number of clock CLK activations from a moment when the path calculation start signal START is enabled to a moment when an output signal SYNC START of the replica delay unit 310 is enabled, and outputs path information PATH<2:0>.

The replica delay unit 310 includes D flip-flops DFF 311 and 313 and a replica delay line 312. The replica delay line 312 is formed based on a value of the total delay that the input signal INPUT goes through inside the chip (for example, delays other than a delay through delayer 230 in FIG. 2). When it is applied to the situation of FIG. 2, the replica delay line 312 has a delay value obtained by summing the delays of the delay A 240 and the delay B 250. The D flip-flops DFF 311 and 313 synchronize the signals START and ASYNC_START with the clock CLK to ensure operations at accurate timings but they are not essential constituent elements. A signal START inputted to the replica delay unit 310 and a signal SYNC_START outputted from the replica delay unit 310 have a difference which is the same as the delay that the input signal INPUT goes through inside the chip without a separate delay compensation unit, which is a sum of the delay A and the delay B.

The first counting unit 320 includes a counting element 321 and a code storage element 322. The counting element 321 counts the number of clock CLK activations in response to the enablement of the path calculation start signal START and outputs code DCNT<2:0>. The code storage element 322 stores the code DCNT<2:0> in response to the enablement of the output signal SYNC_START of the replica delay unit 310. Since the counting of the code DCNT<2:0> starts by the path calculation start signal START and the code DCNT<2:0> is stored by the signal SYNC_START, the code storage element 322 comes to store the number of clock CLK activations that corresponds to the overall delay value of the replica delay unit 310. The code DCNT<2:0> stored in the code storage element 322 is outputted as path information PATH<2:0>. Herein, the counting element 321 is reset when the signal SYNC_START is disabled.

The path calculation start signal START is a signal for initiating an operation of generating path information PATH<2:0>. When the path calculation start signal START is enabled, path information PATH<2:0> is generated. The path calculation start signal START may be enabled during the initial chip operation, or it may be enabled periodically to update the path information PATH<2:0>. Since the generation of the path calculation start signal START may be easily implemented by those of ordinary skill in the art to which the present embodiment pertains, further description on it is omitted.

Figure 4:
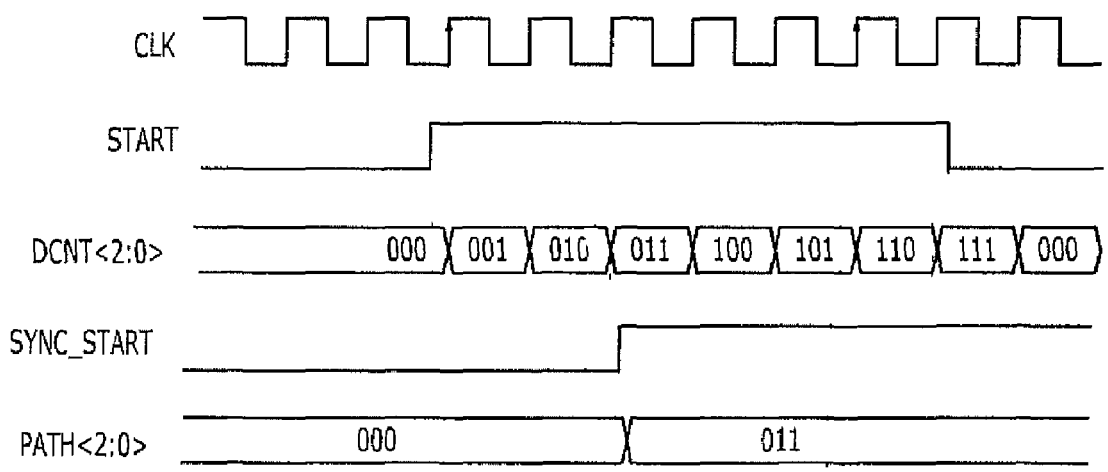
FIG. 4 is a timing diagram describing an operation of the path calculator of FIG. 3.

FIG. 4 is a timing diagram describing an operation of FIG. 3. Referring to FIG. 4, at first, a path calculation start signal START is enabled. In response to the enablement of the path calculation start signal START, the counting element 321 counts the number of clock CLK activations and starts to increase the value of code DCNT<2:0>. Subsequently, an output signal SYNC_START of the replica delay unit 310 is enabled and then the code DCNT<2:0> is stored as path information PATH<2:0> at a moment when the output signal SYNC_START is enabled. The code DCNT<2:0> is a count output indicating a clock count from a moment when the path calculation start signal START is enabled and is stored as path information PATH<2:0> at a moment when the output signal SYNC_START is enabled. Therefore, the path information PATH<2:0> comes to have information corresponding to the delay value of the replica delay unit 310, which is a delay value that the input signal INPUT goes through inside the chip.

Figure 5:
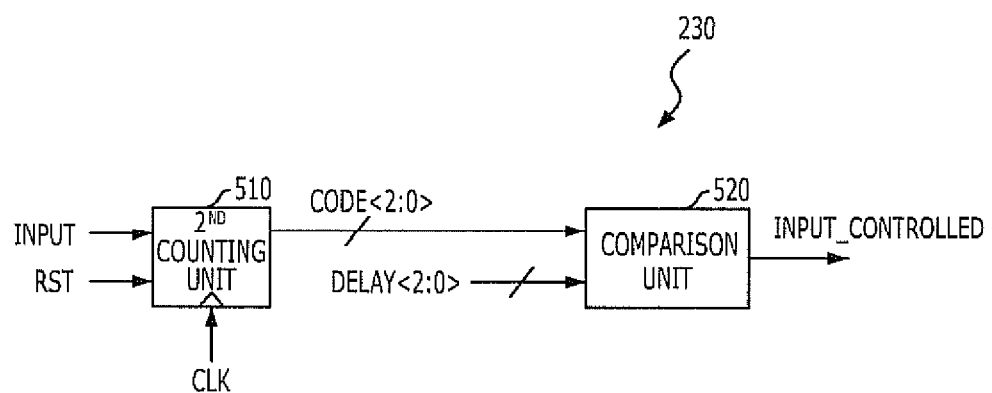
FIG. 5 illustrates a delayer 230 shown in FIG. 2 in accordance with an embodiment of the present invention.

FIG. 5 illustrates a delayer 230 shown in FIG. 2 in accordance with an embodiment of the present invention. Referring to FIG. 5, the delayer 230 includes a second counting unit 510 and a comparison unit 520. The second counting unit 510 counts the number of clock CLK activations from a moment when an input signal INPUT is enabled. The comparison unit 520 enables and outputs an output signal INPUT_CONTROLLED when an output value of the second counting unit 510, which is CODE<2:0>, is the same as delay information PATH<2:0>.

The second counting unit 510 counts the number of clock CLK activations from a moment when the input signal INPUT is enabled and outputs a code CODE<2.0>. The comparison unit 520 compares a value of code CODE<2.0> with a value of delay information DELAY<2:0>, and when the two values are the same, the comparison unit 520 enables an output signal INPUT_CONTROLLED. Therefore, when clock is activated for a number of times equal to the value represented by the delay information DELAY<2:0> after the initial input of the input signal INPUT, the output signal INPUT_CONTROLLED is enabled.

In short, the delayer 230 delays the input signal INPUT by a delay equal to the delay value represented by the delay information DELAY<2:0> and outputs the output signal INPUT_CONTROLLED. For example, when the delay information DELAY<2:0> is 5, the output signal INPUT_CONTROLLED is enabled 5 clocks after the enabling of the input signal INPUT.

A reset RST signal inputted to the second counting unit 510 resets the second counting unit 510. Although FIG. 5 presents an embodiment where the delayer 230 is formed of the second counting unit 510 and the comparison unit 520, it is obvious to those skilled in the art that a circuit outputting the input signal INPUT after delaying the input signal INPUT by a delay corresponding to the delay information DELAY<2:0> may be formed differently from the embodiment shown in FIG. 5.

Figure 6:
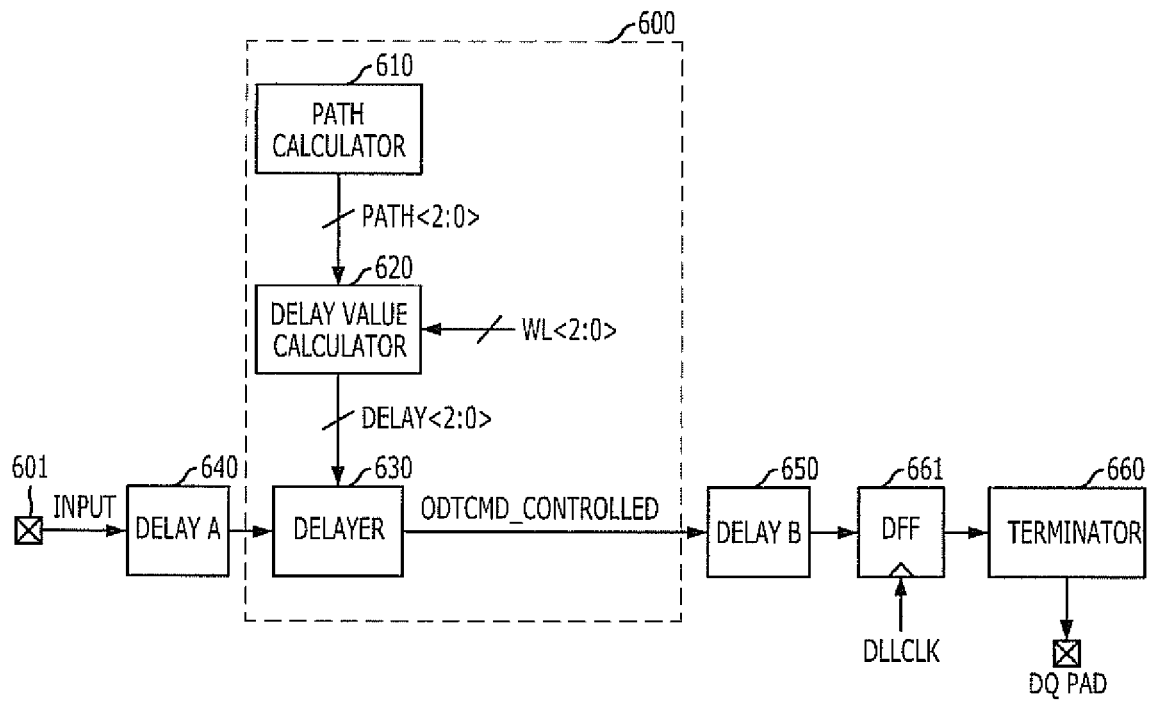
FIG. 6 is a block view describing a latency control circuit applied to a semiconductor memory device in accordance with an embodiment of the present invention.

FIG. 6 is a block view describing a latency control circuit 600 applied to a semiconductor memory device in accordance with an embodiment of the present invention. Referring to FIG. 6, the semiconductor memory device of the present embodiment includes a path calculator 610, a delay value calculator 620, a delayer 630, and a terminator 660. The path calculator 610 calculates a delay value of a path that a termination command ODTCMD is to pass through inside a chip (for example, delays other than through the delayer 630) and outputs path information PATH<2:0>. The delay value calculator 620 outputs delay information DELAY<2:0> representing a delay value for delaying the termination command ODTCMD based on a value of write latency WL<2:0> and a value of the path information PATH<2:0>. The delayer 630 delays the termination command ODTCMD by a delay corresponding to delay information DELAY<2:0>. The terminator 660 terminates an input pad DQ PAD in response to a signal ODTCMD_CONTROLLED outputted from the delayer 630.

The termination command ODTCMD is a command inputted to an ODT PAD 601, and the terminator 660 of a semiconductor memory device should perform a termination onto a data input pad DQ PAD when a delay time corresponding to a write latency WL passes from a moment when the termination command ODTCMD is inputted. The write latency WL is defined as a value obtained by summing an additive latency AL and CAS write latency CWL. A delay A 640 shown in the drawing is a delay that the termination command ODTCMD goes through from a moment when the termination command ODTCMD is applied to the ODT PAD 601 to a moment when the termination command ODTCMD is inputted to the latency control circuit 600. A delay B 650 is a delay that a termination command ODTCMD_CONTROLLED outputted from the latency control circuit goes through until the termination command ODTCMD_CONTROLLED is transferred to the terminator 660. Therefore, the path information PATH<2:0> has information on a delay value obtained by summing the delays of the delay A 640 and the delay B 650. A D flip-flop DFF 661 is provided to synchronize the termination command ODTCMD_CONTROLLED with a DLL (delay locked loop) clock DLLCLK. The termination command ODTCMD_CONTROLLED is synchronized with the DLL clock DLLCLK because the terminator 660 performing a termination onto the data input pad DQ PAD operates in synchronization with the DLL clock DLLCLK.

FIG. 6 illustrates an embodiment where the latency control circuit 600 is applied to a semiconductor memory device and controls the latency of the termination command ODTCMD. Since the structure and operation of the latency control circuit 600 has been described in detail with reference to FIGS. 2 to 5, further description on them is omitted.

Herein, referring back to FIGS. 2 to 5, a method for controlling a latency will be described in accordance with an embodiment of the present disclosure.

The method for controlling a latency includes generating path information PATH<2:0> based on a delay value of a path that an input signal INPUT is to go through inside a semiconductor chip (refer to the operation of the path calculator 210); subtracting a value of path information PATH<2:0> from a value of latency information LATENCY<2:0> of the input signal INPUT (refer to the operation of the delay value calculator 220) to generate delay <2:0>; and outputting a delayed input signal INPUT_CONTROLLED by delaying the input signal INPUT by an additional delay corresponding to delay information DELAY<2:0>.

The generation of the path information PATH<2:0> may include delaying a path calculation start signal START by the same delay value as a delay value of a path that the input signal INPUT is to go through inside the chip and outputting a delayed path calculation start signal SYNC_START; counting the number of clocks CLK inputted from a moment when the path calculation start signal START is enabled to a moment when the delayed path calculation start signal SYNC_START is enabled.

The outputting of the delayed input signal by delaying the input signal INPUT by a delay corresponding to delay information DELAY<2:0> includes counting the number of clock CLK activations from a moment when the input signal INPUT is enabled; and when the counting result, which is code CODE<2.0>, is the same as delay information DELAY<2:0>, enabling the output signal INPUT_CONTROLLED.

According to an embodiment of the present invention, a delay value of an input signal is calculated and path information is generated based on the delay value of the input signal. A latency control circuit calculates a delay value to be applied to delaying an input signal based on latency information and path information. Therefore, the latency control circuit delays the input signal for a delay corresponding to the latency delay exactly. As a result, the input signal arrives at a target circuit at exact time, and the target circuit operates at an exact timing, that is, according to the designed latency period.

Also, according to an embodiment of the present invention, a delay value of the input signal through a chip is calculated and taken into in complying with a latency scheme. Therefore, although the process, voltage and/or temperature are changed and the delay value inside a chip is changed, the intended delay through the chip is met accurately. Therefore, operations of the chip are performed accurately in terms of timings.

While the present invention has been described with respect to the specific embodiments, it will be apparent to those skilled in the art that various changes and modifications may be made without departing from the spirit and scope of the invention as defined in the following claims.

What is claimed is:

1. A latency control circuit, comprising:
   a path calculator configured to calculate a delay value of a path that an input signal is to go through inside a chip and output the delay value as path information;
   a delay value calculator configured to output delay information representing a delay value for delaying the input signal based on a latency value of the input signal and the path information; and
   a delayer configured to delay the input signal by a delay corresponding to the delay information.

2. The latency control circuit of claim 1, wherein the delay value calculator is configured to generate the delay information by subtracting a value of the path information from the latency value.

3. The latency control circuit of claim 2, wherein the path information and the delay information each represent a number of clock cycles.

4. The latency control circuit of claim 1, wherein the path calculator includes:
   a replica delay unit configured to have the same delay value as a delay value of the path that the input signal is to go through inside the chip, delay a path calculation start signal, and output a delayed path calculation start signal; and
   a first counting unit configured to count the number of clock activations from a moment when the path calculation start signal is enabled to a moment when an output signal of the replica delay unit is enabled and output the path information.

5. The latency control circuit of claim 4, wherein the replica delay unit includes:
   a first flip-flop configured to receive and synchronize the path calculation start signal with the clock;
   a replica delay line configured to have the same delay value as the delay value of the path that the input signal is to go through inside the chip, delay an output signal of the first flip-flop, and output a delayed output signal; and
   a second flip-flop configured to receive and synchronize the output signal of the replica delay line with the clock and output a synchronized signal.

6. The latency control circuit of claim 1, wherein the delayer includes:
   a second counting unit configured to count the number of clock activations from a moment when the input signal is enabled; and
   a comparator configured to enable and output an output signal when an output value of the second counting unit is the same as a value of the path information.

7. A semiconductor memory device, comprising:
   a path calculator configured to calculate a delay value of a path that a termination command is to go through inside the semiconductor memory device and output the calculated delay value as path information;
   a delay value calculator configured to output delay information representing a delay value for delaying the termination command based on a write latency and the path information;
   a delayer configured to delay the termination command by a delay corresponding to the delay information; and a terminator configured to perform a termination onto an input pad in response to an output signal of the delayer.

8. The semiconductor memory device of claim 7, further comprising:
a synchronizer configured to synchronize the output signal of the delayer with a delay locked loop (DLL) clock and transfer the synchronized signal to the terminator.

9. The semiconductor memory device of claim 7, wherein the path information includes information on a delay value obtained by summing a delay value from a time when the termination command is inputted from outside the semiconductor memory device to a time when the termination command is inputted to the delayer and a delay value from a time when the output signal of the delayer is output from the delayer to a time that the output signal of the delayer is transferred to the terminator.

10. The semiconductor memory device of claim 7, wherein the write latency is a sum of an additive latency and a CAS write latency.

11. The semiconductor memory device of claim 7, wherein the delay value calculator is configured to generate the delay information by subtracting a value of the path information from a value of the write latency.

12. A method for controlling a latency of an input signal inputted from outside a semiconductor chip, comprising:
generating path information based on a delay value of a path that an input signal is to go through inside the chip and;
generating delay information based on a latency value of the input signal and the path information; and
delaying the input signal by a delay corresponding to the delay information and outputting a delayed input signal.

13. The method of claim 12, wherein the delay information is generated by subtracting a value of the path information from the latency value.

14. The method of claim 13, wherein the calculating of the delay value of the path that the input signal is to go through inside the chip and generating the path information includes:
delaying a path calculation start signal by the same delay value as the delay value of the path that the input signal is to go through inside the chip and outputting a delayed path calculation start signal; and
counting the number of clock activations from a time that the path calculation start signal is enabled to a time that the delayed path calculation start signal is enabled and outputting the path information.

15. The method of claim 13, wherein the delaying of the input signal by a delay corresponding to the delay information and outputting of a delayed input signal includes:
counting the number of clock activations from a time that the input signal is enabled; and
enabling an output signal when the counting result obtained by the counting of the number of clock activations from the time that the input signal is enabled is the same as the path information.

* * * * *